US007446568B2

(12) United States Patent
Chang et al.

(10) Patent No.: US 7,446,568 B2
(45) Date of Patent: Nov. 4, 2008

(54) RECEIVER START-UP COMPENSATION CIRCUIT

(75) Inventors: Chin-Tien Chang, Tainan County (TW); Chien-Ru Chen, Tainan County (TW); Ying-Lieh Chen, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 52 days.

(21) Appl. No.: 11/420,771

(22) Filed: May 29, 2006

(65) Prior Publication Data

US 2007/0273434 A1 Nov. 29, 2007

(51) Int. Cl.
*H03K 19/0175* (2006.01)
*H03K 19/094* (2006.01)

(52) U.S. Cl. ............................ 326/82; 326/83; 326/86; 326/89; 326/90; 326/92; 326/62

(58) Field of Classification Search .......... 713/300–340
See application file for complete search history.

(56) References Cited

U.S. PATENT DOCUMENTS 5,155,384 A * 10/1992 Ruetz ......................... 327/537
6,144,226 A * 11/2000 Fairbanks .................. 326/113
6,194,955 B1 2/2001 Ishida
6,285,223 B1 * 9/2001 Smith ......................... 327/143
7,245,165 B2 7/2007 De Langen
2004/0212421 A1 * 10/2004 Naka et al. .................. 327/541

FOREIGN PATENT DOCUMENTS

CN 1312535 A 9/2001
CN 1711687 A 12/2005

* cited by examiner

*Primary Examiner*—Rexford Barnie
*Assistant Examiner*—Matthew C Tabler
(74) *Attorney, Agent, or Firm*—Winston Hsu

(57) ABSTRACT

An integrated circuit includes a current mirror circuit for providing a current at an output end, a power-down switch coupled to the output end of the current mirror circuit for controlling access of the current generated by the current mirror circuit based on signals received at a control end of the power-down switch, and a compensating unit coupled to a bias end of the current mirror circuit and the power-down switch for stabilizing voltages at the bias end of the current mirror circuit.

18 Claims, 5 Drawing Sheets

RECEIVER START-UP COMPENSATION CIRCUIT

BACKGROUND OF THE INVENTION

1. Field of the Invention

The present invention relates to a receiver start-up compensation circuit, and more particularly, to a receiver start-up compensation circuit providing fast wake-up from a power-down mode.

2. Description of the Prior Art

Flat panel displays (FPD), characterized by light weight, low power consumption, and low radiation, are widely applied in portable electronic products such as notebook computers and personal digital assistants (PDAs). Therefore, it is necessary to design receivers for such displays in such a way so that the power consumption is as low as possible. For power-saving purpose, when an FPD has not received commands for a certain period of time, the receiver of the FPD begins to work in a power-down mode in which no current is being outputted. Upon receiving an activating signal from the FPD, the receiver leaves the power-down mode and enters a normal mode in which operational current is supplied to the FPD. The ability to quickly switch between the power-down mode and the normal mode is crucial to the performance of the FPD.

FIG. 1 shows a diagram of a prior art receiver circuit 10 of a display device. The receiver circuit 10 includes a reference current source Iref, a wake-up current source Im, and P-type metal oxide semiconductor (PMOS) transistors P1-P3. The PMOS transistors P1 and P2 form a current mirror circuit, in which the gates of the PMOS transistors P1 and P2 are coupled to each other at a node A of the receiver circuit 10, and the sources of the PMOS transistors P1 and P2 are coupled to a bias voltage VDD. The drain of the PMOS transistor P1 is coupled to the reference current source Iref. In order to generate a large output current Iout from a small current provided by the current source Iref, the size (W/L ratio) of the PMOS transistor P2 is usually larger than that of the PMOS transistor P1. Consequently, the capacitance C2 of the PMOS transistor P2 is larger than the capacitance C1 of the PMOS transistor P1. The drain current generated by "mirroring" the current supplied by the reference current source Iref using the PMOS transistor P1 to P2 is represented by Id. The PMOS transistor P3 has a source coupled to the drain of the PMOS transistor P2 at a node B of the receiver circuit 10, a drain coupled to a node C of the receiver circuit 10, and a gate coupled to a control voltage ENB. The wake-up current source Im is coupled between the bias voltage VDD and the node C of the receiver circuit 10.

When the receiver circuit 10 works in the power-down mode, the control voltage ENB is set to the bias voltage VDD, thereby turning off the PMOS transistor P3. The PMOS transistors P1 and P2 are turned on, and the voltage at the node B of the receiver circuit 10 is charged to VDD. The turned-off PMOS transistor P3 blocks the drain current Id of the PMOS transistor P2, and the output current Iout generated by the receiver circuit 10 in the power-down mode is near zero. For the receiver 10 to exit the power-down mode, the control voltage ENB is set to ground, thereby turning on the PMOS transistor P3 and pulling down the voltage at the node B to a voltage VB. The turned-on PMOS transistor P3 allows the drain current Id of the PMOS transistor P2 to pass, and the output current Iout generated by the receiver circuit 10 in the normal mode is equal to Id. The wake-up current source Im provides a small current for keeping the voltage of the node B of the receiver circuit 10 at a certain level, so that the receiver circuit 10 can switch faster between the power-down mode and the normal mode.

When the receiver circuit 10 exits the power-down mode, a voltage difference ΔVB is generated at the node B of the receiver circuit 10, which is then coupled to the node A of the receiver circuit 10 by a gate-to-drain capacitance C2 of the PMOS transistor P2, resulting in a voltage difference ΔVA generated at the node A of the receiver circuit 10. The amount of charges coupled to the node A from the node B of the receiver circuit 10 is represented by Q. The charges Q injected into the node A of the receiver circuit 10 is discharged by a gate-to-drain capacitance C1 of the PMOS transistor P1 until the voltage at the node A is stabilized. ΔVA, ΔVB, and Q can be represented by the following formulae:

$$Q=C2*\Delta VB;$$

$$\Delta VA=Q/C1=\Delta VB*(C2/C1);$$

$$\Delta VB=VDD-VB;$$

The charges Q causing the voltage difference ΔVA at the node A of the receiver circuit 10 can be stabilized by the PMOS transistor P1. Since C2 is larger than C1, the receiver circuit 10 has to wait for a long time before and the voltage at the node A becomes stable again. Therefore, the long wait time for the receiver circuit 10 to resume working in the normal mode largely influences the performance of the display device.

FIG. 2 shows a diagram of another prior art receiver circuit 20 of a display device. The receiver circuit 20 differs from the receiver circuit 10 in that the receiver circuit 20 further includes a capacitor Cap coupled between the bias voltage VDD and the node A of the receiver circuit 20. The capacitance of the capacitor Cap is represented by C3. When the receiver circuit 20 exits the power-down mode, a voltage difference ΔVB is generated at the node B of the receiver circuit 20, which is then coupled to the node A of the receiver circuit 20 by a gate-to-drain capacitance C2 of the PMOS transistor P2, resulting in a voltage difference ΔVA' generated at the node A of the receiver circuit 20. The amount of charges coupled to the node A from the node B of the receiver circuit 20 is represented by Q. The charges Q injected into the node A of the receiver circuit 20 is discharged by a gate-to-drain capacitance C1 of the PMOS transistor P1 and the capacitor Cap until the voltage at the node A is stabilized. ΔVA', ΔVB, and Q can be represented by the following formulae:

$$Q=C2*\Delta VB;$$

$$\Delta VA'=Q/(C1+C3)=\Delta VB*C2/(C1+C3);$$

$$\Delta VB=VDD-VB;$$

With the capacitor Cap, ΔVA' is smaller than ΔVA, which means the charges Q causing the voltage difference ΔVA' at the node A of the receiver circuit 20 can be discharged faster. Therefore, the wait time for the receiver circuit 20 to resume working in the normal mode is shorter than that for the receiver circuit 10. However, the capacitor Cap occupies extra space and increases manufacturing cost. Also, the capacitor Cap lengthens the settling time of the receiver circuit 20.

SUMMARY OF THE INVENTION

The claimed invention provides a receiver start-up compensation circuit comprising a bias voltage source; a current mirror circuit for providing a current at an output end; a power-down switch coupled to the output end of the current mirror circuit for controlling access of the current generated by the current mirror circuit based on a first control signal received at a control end of the power-down switch; and a compensating unit coupled to a bias end of the current mirror circuit and the power-down switch for stabilizing voltages at the bias end of the current mirror circuit by providing charges at the bias end of the current mirror circuit based on signals received at control ends of the compensating unit.

The claimed invention also provides a receiver start-up compensation circuit comprising a current mirror circuit having an output end selectively coupled to an output end of the receiver start-up compensation circuit; and a capacitor having a first end coupled to a bias end of the current mirror circuit; wherein a second end of the capacitor is selectively coupled to the output end of the receiver start-up compensation circuit or to receive a bias voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
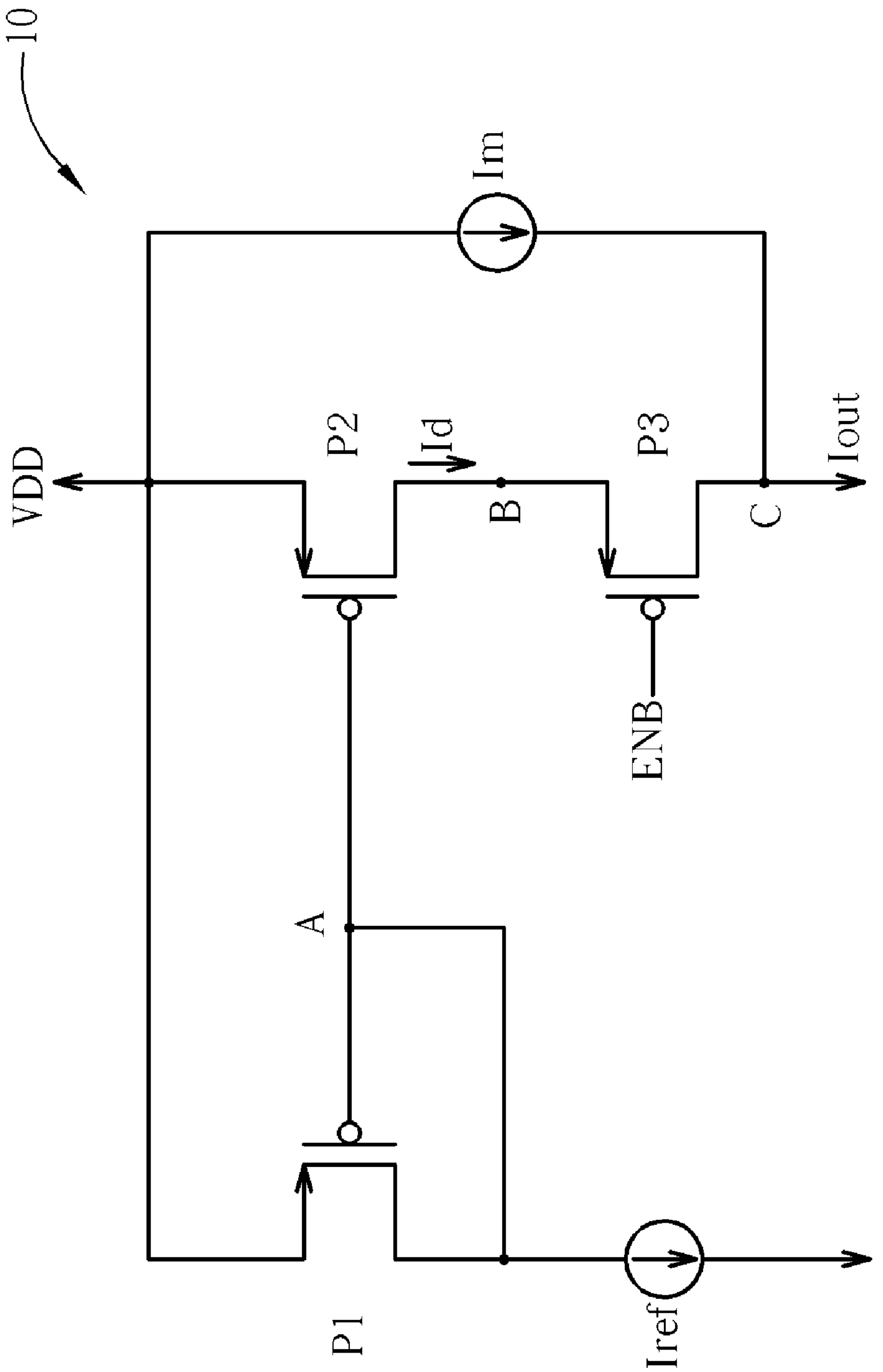
Fig. 1 Prior art
FIG. 1 shows a diagram of a prior art receiver circuit of a display device.
Figure 2:
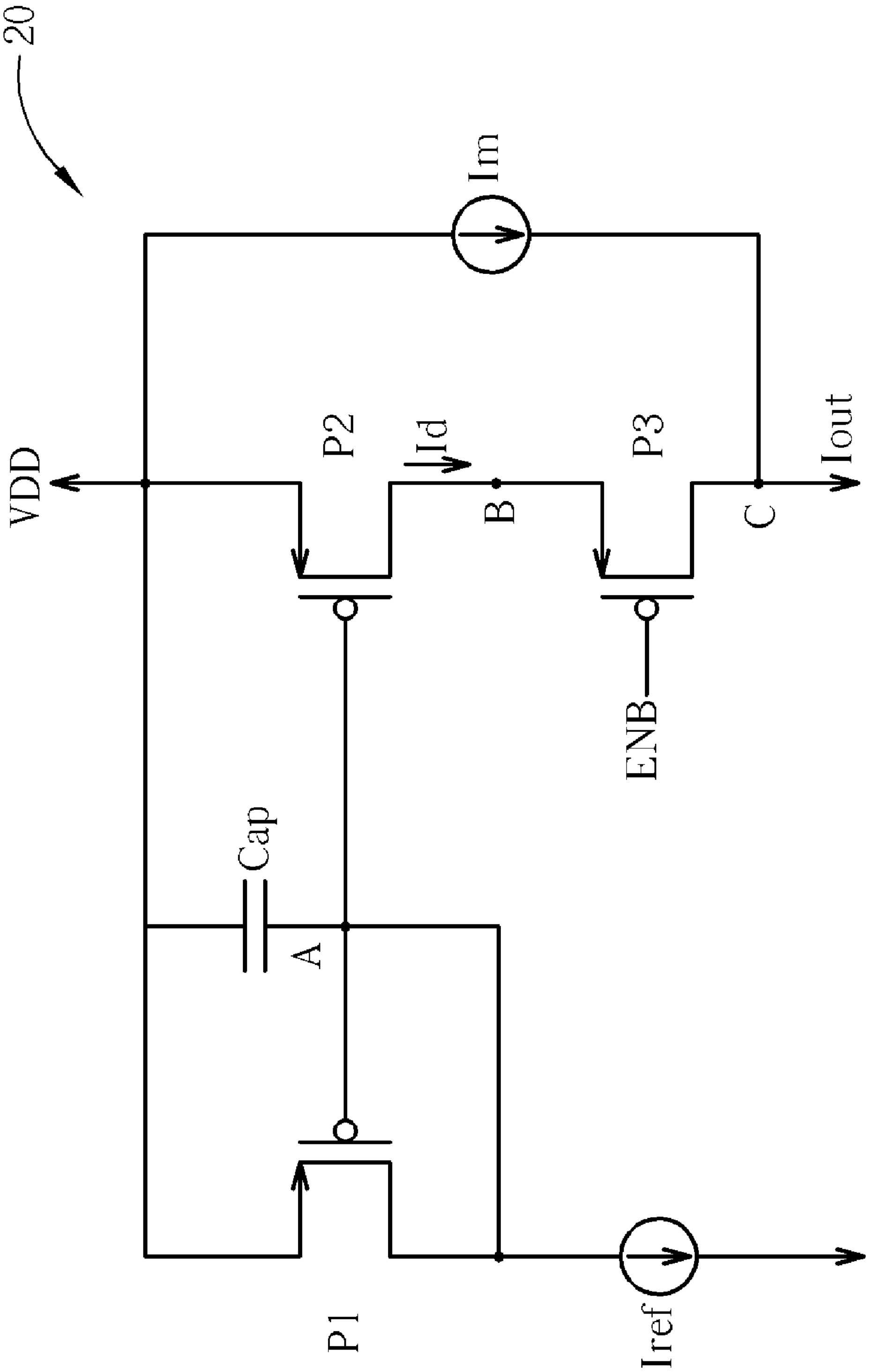
Fig. 2 Prior art
FIG. 2 shows a diagram of another prior art receiver circuit of a display device.
Figure 3:
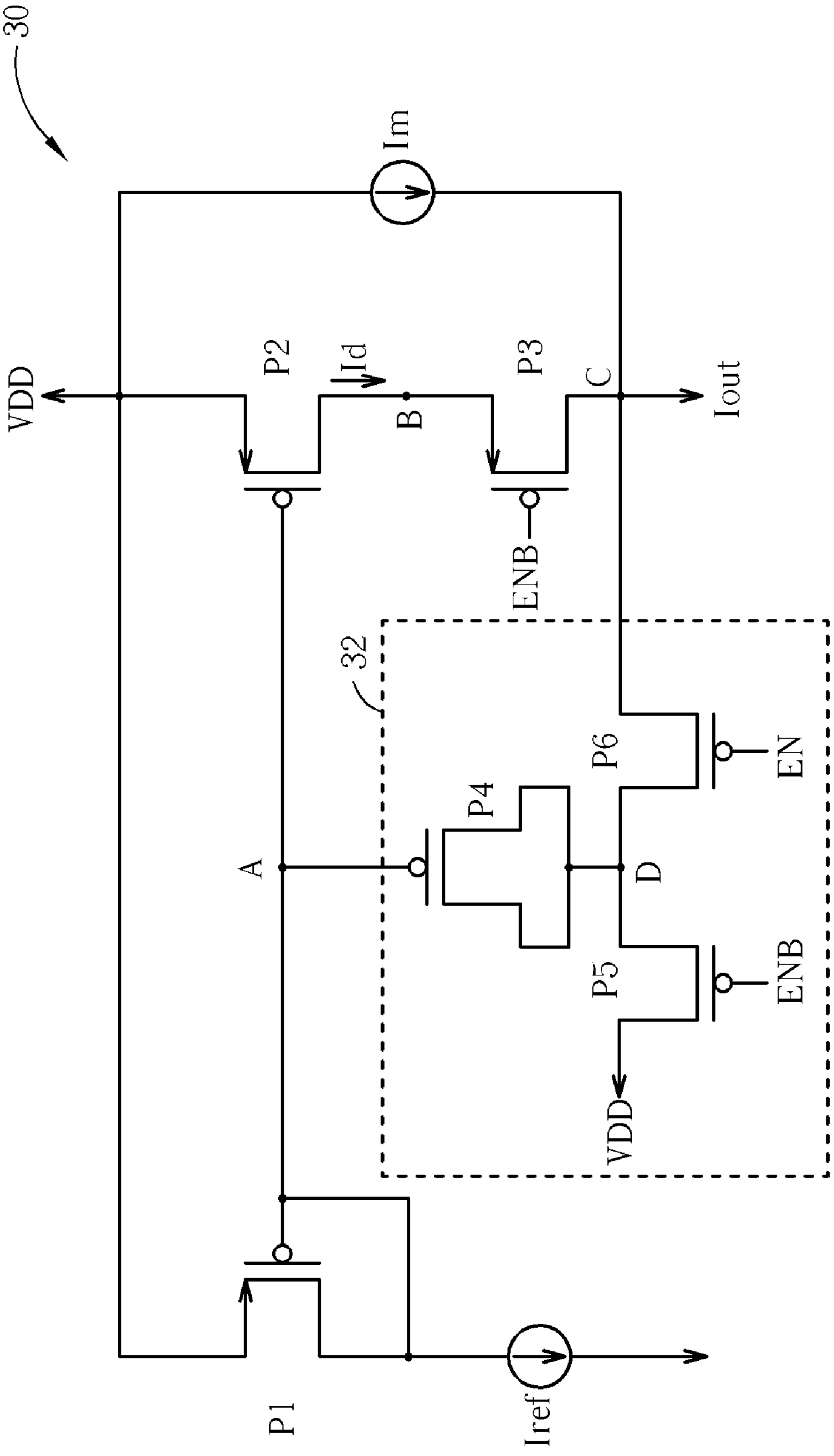
FIG. 3 shows a diagram of a receiver start-up compensation circuit of a display device according to a first embodiment of the present invention.

FIG. 3 shows a diagram of a receiver start-up compensation circuit 30 of a display device according to a first embodiment of the present invention. The receiver start-up compensation circuit 30 includes a reference current source Iref, a wake-up current source Im, a compensating unit 32, and PMOS transistors P1-P3. The PMOS transistors P1 and P2 form a current mirror circuit, in which the gates of the PMOS transistors P1 and P2 are coupled to each other at a node A of the receiver start-up compensation circuit 30, and the sources of the PMOS transistors P1 and P2 are coupled to a bias voltage VDD. The drain of the PMOS transistor P1 is coupled to the reference current source Iref. In order to generate a large output current Iout from a small current provided by the current source Iref, the size (W/L ratio) of the PMOS transistor P2 is usually larger than that of the PMOS transistor P1. Consequently, the capacitance C2 of the PMOS transistor P2 is larger than the capacitance C1 of the PMOS transistor P1. The drain current generated by "mirroring" the current supplied by the reference current source Iref using the PMOS transistor P1 to P2 is represented by Id. The PMOS transistor P3 has a source coupled to the drain of the PMOS transistor P2 at a node B of the receiver start-up compensation circuit 30, a drain coupled to a node C of the receiver start-up compensation circuit 30, and a gate coupled to a control voltage ENB. The wake-up current source Im is coupled between the bias voltage VDD and the node C of the receiver start-up compensation circuit 30. Nodes A and B respectively represent a bias end and an output end of the current mirror formed by the PMOS transistors P1 and P2. The gate of the PMOS transistor P3 represents a control end for receiving the control voltage ENB, based on which the PMOS transistor P3 is turned on or off.

In this embodiment, the compensating unit 32 of the receiver start-up compensation circuit 30 includes PMOS transistors P4-P6. The PMOS transistor P4 includes a gate coupled to the node A of the receiver start-up compensation circuit 30, and a drain and a source coupled to each other at a node D of the receiver start-up compensation circuit 30. The PMOS transistors P5 and P6 are coupled in series between the bias voltage VDD and the node C of the receiver start-up compensation circuit 30. The PMOS transistors P5 and P6 are turned on or off based on the control voltage ENB and a control voltage EN applied to the gates of the transistors P5 and P6, respectively. Therefore, the gates of the transistors P5 and P6 represent control ends of the compensating unit 32. The control voltages ENB and EN are applied in a manner so that one of the PMOS transistors P5 and P6 is turned on while the other is turned off.

When the receiver start-up compensation circuit 30 works in the power-down mode, the control voltages ENB and EN are set to the bias voltage VDD and ground respectively, thereby turning off the PMOS transistors P3 and P5 and turning on the PMOS transistors P1, P2 and P6. The nodes B and C of the receiver start-up compensation circuit 30 are charged to VDD and a voltage VC, respectively. Since the PMOS transistor P6 is turned on, the node D of the receiver start-up compensation circuit 30 is also charged to VC. The turned-off PMOS transistor P3 blocks the drain current Id of the PMOS transistor P2, and the output current Iout generated by the receiver start-up compensation circuit 30 in the power-down mode is near zero. For the receiver start-up compensation circuit 30 to exit the power-down mode, the control voltages ENB and EN are set to ground and the bias voltage VDD respectively, thereby turning on the PMOS transistors P3 and P5. The turned-on PMOS transistor P3 allows the drain current Id of the PMOS transistor P2 to pass, and the output current Iout generated by the receiver start-up compensation circuit 30 in the normal mode is equal to Id. The wake-up current source Im provides a small current for keeping the voltage of the node B of the receiver start-up compensation circuit 30 at a certain level, so that the receiver start-up compensation circuit 30 can switch faster between the power-down mode and the normal mode.

When the receiver start-up compensation circuit 30 exits the power-down mode, a voltage difference ΔVB is generated at the node B of the receiver start-up compensation circuit 30, which is then coupled to the node A of the receiver start-up compensation circuit 30 by a gate-to-drain capacitance C2 of the PMOS transistor P2. Also, since the node D of the receiver start-up compensation circuit 30 is now coupled to the bias voltage VDD via the turned-on PMOS transistor P5, a voltage difference ΔVD is generated at the node D of the receiver start-up compensation circuit 30, which is then coupled to the node A of the receiver start-up compensation circuit 30 via the PMOS transistor P4 having a capacitance C4 equal to twice the gate-to-drain capacitance of the PMOS transistor P4. The amounts of charges coupled to the node A from the nodes B and D of the receiver start-up compensation circuit 30 are represented by Qb and Qd, respectively. The charges Qb and Qd can be represented by the following formulae:

$$Qb=C2*(VDD-VB);$$

$$Qd=C4*(VC-VDD);$$

In order to stabilize the node A of the receiver start-up compensation circuit 30 as fast as possible, the charges Qb causing the voltage variation ΔVA at the node A is compensated by injecting the charges Qd using the PMOS transistor P4. Assuming that the PMOS transistor P3 is ideally conducted when turned on, and ideally cut off when turned off, the voltage VB is equal to the voltage VC. The sum of the charges Qb and Qd is equal to zero when C2 and C4 are equal. Since the drain and source of the PMOS transistor P4 are coupled together, the capacitance C4 is equal to twice the gate-to-drain capacitance of the PMOS transistor P4. Therefore, the W/L ratio of the PMOS transistor P4 can be set to be half the W/L ratio of the PMOS transistor P2. Therefore, the charges Qb are compensated by the charges Qd, and the node A of the receiver start-up compensation circuit 30 can be stabilized very fast. The receiver start-up compensation circuit 30 can provide short wait time for re-entering the normal mode and improve the efficiency of the display device.

In reality, since the PMOS transistor P3 is not an ideal switch, the voltage VB is actually larger than the voltage VC. Therefore, the W/L ratio of the PMOS transistor P4 can be slightly larger than half the W/L ratio of the PMOS transistor P2 for better compensating the charges Qb.

Figure 4:
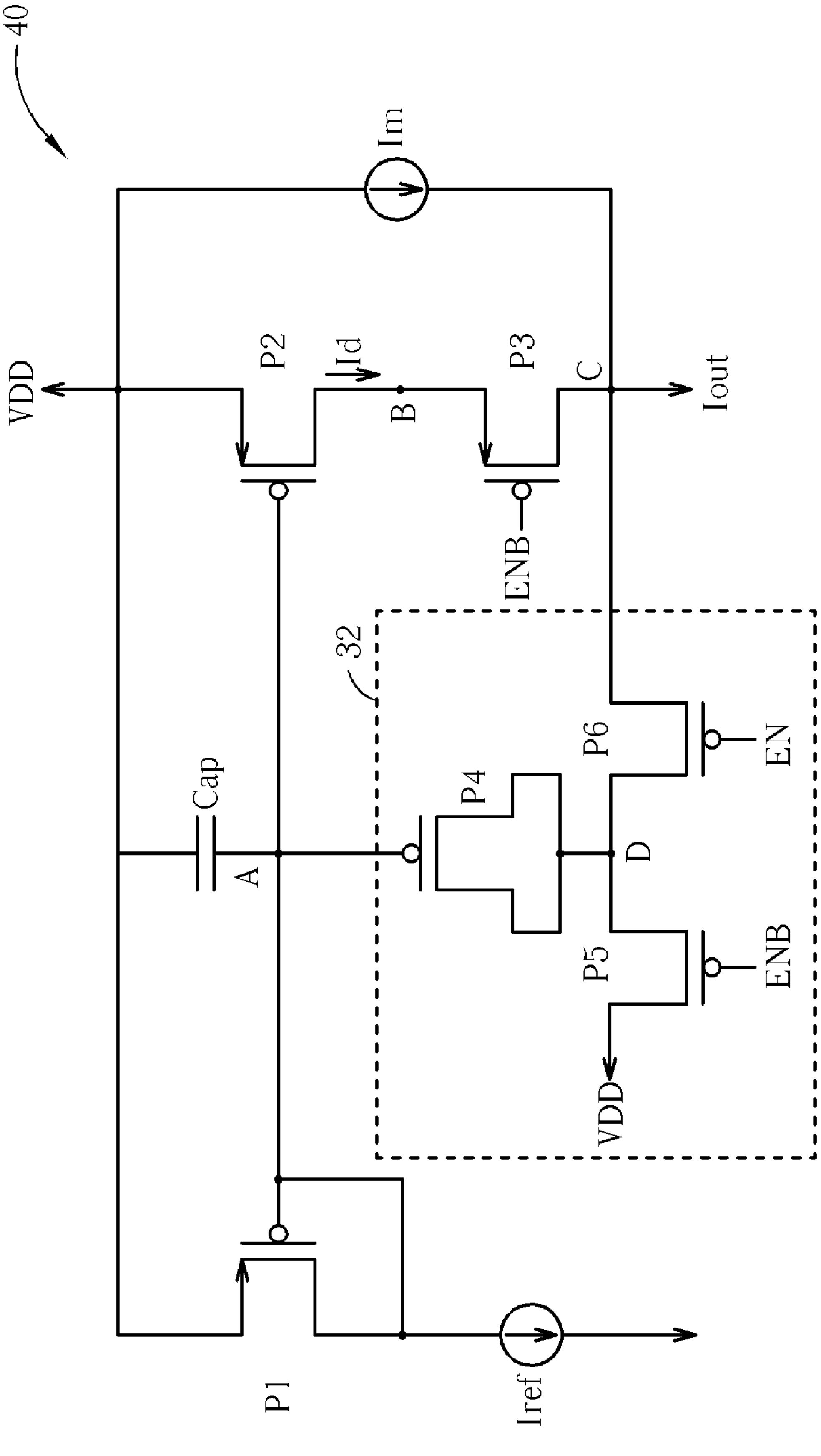
FIG. 4 shows a diagram of a receiver start-up compensation circuit of a display device according to a second embodiment of the present invention.

FIG. 4 shows a diagram of a receiver start-up compensation circuit 40 of a display device according to a second embodiment of the present invention. The receiver start-up compensation circuit 40 differs from the receiver start-up compensation circuit 30 in that the receiver start-up compensation circuit 40 further comprises a capacitor Cap coupled between the bias voltage VDD and the node A of the receiver start-up compensation circuit 40. The PMOS transistors P1 and P2 in the receiver start-up compensation circuit 40 also form a current mirror circuit, generating a drain current Id by "mirroring" the current provided by the current source Iref. The PMOS transistor P3 in the receiver start-up compensation circuit 40 also controls the path of the drain current Id based on a control signal ENB received at the gate. Nodes A and B respectively represent a bias end and an output end of the current mirror formed by the PMOS transistors P1 and P2. The gate of the PMOS transistor P3 represents a control end for receiving the control voltage ENB, based on which the PMOS transistor P3 is turned on or off.

When the receiver start-up compensation circuit 40 exits the power-down mode, a voltage difference ΔVB is generated at the node B of the receiver start-up compensation circuit 40, which is then coupled to the node A of the receiver start-up compensation circuit 40 by a gate-to-drain capacitance C2 of the PMOS transistor P2. Also, a voltage difference ΔVD is generated at the node D of the receiver start-up compensation circuit 40, which is then coupled to the node A of the receiver start-up compensation circuit 40 via the PMOS transistor P4 having a capacitance C4 equal to twice the gate-to-drain capacitance of the PMOS transistor P4. The amounts of charges coupled to the node A from the nodes B and D of the receiver start-up compensation circuit 40 are also represented by Qb and Qd, respectively.

In the receiver start-up compensation circuit 40, the charges Qb can be compensated by the PMOS transistor P4 (by providing the charges Qd) together with the capacitor Cap. With the contribution of the capacitor Cap in stabilizing the voltage at the node A, the W/L ratio of the PMOS transistor P4 can be set to a value lower than half the W/L ratio of the PMOS transistor P2. The receiver start-up compensation circuit 40 can provide even shorter wait time for re-entering the normal mode and improve the efficiency of the display device.

Figure 5:
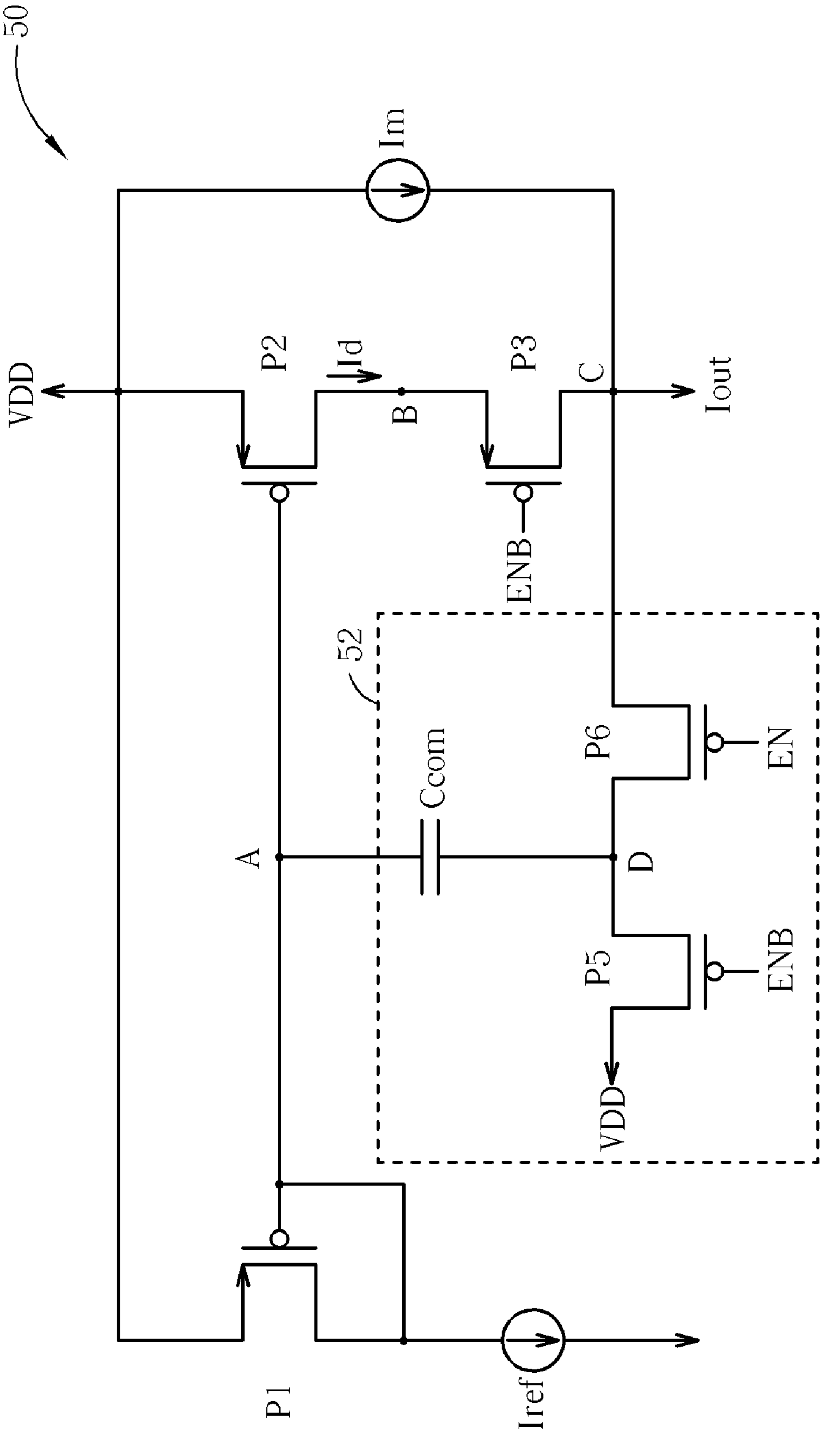
FIG. 5 shows a diagram of a receiver start-up compensation circuit of a display device according to a third embodiment of the present invention.

FIG. 5 shows a diagram of a receiver start-up compensation circuit 50 of a display device according to a third embodiment of the present invention. The receiver start-up compensation circuit 50 differs from the receiver start-up compensation circuit 30 in that the receiver start-up compensation circuit 50 includes a compensating unit 52 having a capacitor Ccom and PMOS transistors P5 and P6. One end of the capacitor Ccom is coupled to the node A of the receiver start-up compensation circuit 50, while the other end of the capacitor Ccom is coupled to the bias voltage VDD via the PMOS transistor P5 and to the node C of the receiver start-up compensation circuit 50 via the PMOS transistor P6. The PMOS transistors P5 and P6 are turned on or off based on a control voltage ENB and a control voltage EN applied to the gates of the transistors P5 and P6, respectively. Therefore, the gates of the transistors P5 and P6 represent control ends of the compensating unit 52. The control voltages ENB and EN are applied in a manner so that one of the PMOS transistors P5 and P6 is turned on while the other is turned off.

When the receiver start-up compensation circuit 50 exits the power-down mode, a voltage difference ΔVB is generated at the node B of the receiver start-up compensation circuit 50, which is then coupled to the node A of the receiver start-up compensation circuit 50 by a gate-to-drain capacitance C2 of the PMOS transistor P2. Also, a voltage difference ΔVD is generated at the node D of the receiver start-up compensation circuit 50, which is then coupled to the node A of the receiver start-up compensation circuit 50 via the capacitor Ccom having a capacitance equal to or slightly larger than the gate-to-drain capacitance C2 of the PMOS transistor P2. The amounts of charges coupled to the node A from the nodes B and D of the receiver start-up compensation circuit 50 are also represented by Qb and Qd, respectively. Therefore, the charges Qb are compensated by the charges Qd, and the node A of the receiver start-up compensation circuit 50 can be stabilized very fast. The receiver start-up compensation circuit 50 can provide short wait time for re-entering the normal mode and improve the efficiency of the display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver start-up compensation circuit comprising:
- a bias voltage source;
- a current mirror circuit for providing a current at an output end, the current mirror comprising:
  - a reference current source;
  - a first PMOS transistor including:
    - a source coupled to the bias voltage source;
    - a drain coupled to the reference current source; and
    - a gate coupled to a bias end of the current mirror circuit and the drain of the first PMOS transistor; and
  - a second PMOS transistor including:
    - a source coupled to the bias voltage source;
    - a drain coupled to the output end of the current mirror circuit; and
    - a gate coupled to the bias end of the current mirror circuit;
- a power-down switch coupled to the output end of the current mirror circuit for controlling access of the current generated by the current mirror circuit based on a first control signal received at a control end of the power-down switch; and a compensating unit coupled to the bias end of the current mirror circuit and the power-down switch for stabilizing voltages at the bias end of the current mirror circuit by providing charges at the bias end of the current mirror circuit based on signals received at control ends of the compensating unit, the compensating unit comprising:

a fourth PMOS transistor having a source and a drain directly coupled to each other regardless of the status of the first control signal, and a gate coupled to the bias end of the current mirror circuit;

a first control switch coupled between the source of the fourth PMOS transistor and the bias voltage source, and including a control end coupled to receive the first control signal for controlling passages between the fourth PMOS transistor and the bias voltage source; and a second control switch coupled between the source of the fourth PMOS transistor and the power-down switch, and including a control end coupled to receive a second control signal for controlling passages between the fourth PMOS transistor and the power-down switch.

2. The receiver start-up compensation circuit of claim 1 further comprising:

a capacitor coupled between the bias voltage source and the bias end of the current mirror circuit.

3. The receiver start-up compensation circuit of claim 1 further comprising a wake-up current source coupled in parallel with the second PMOS transistor and the power-down switch.

4. The receiver start-up compensation circuit of claim 1 wherein the power-down switch includes a third PMOS transistor having a source coupled to the drain of the second PMOS transistor.

5. The receiver start-up compensation circuit of claim 1 wherein the second control switch includes a control end coupled to receive a second control signal having a phase opposite to that of the first control signal for controlling passages between the fourth PMOS transistor and the power-down switch.

6. The receiver start-up compensation circuit of claim 1 wherein the first and second control switches include PMOS transistors.

7. The receiver start-up compensation circuit of claim 1 wherein a width-to-length ratio of the fourth PMOS transistor is half a width-to-length ratio of the second PMOS transistor.

8. The receiver start-up compensation circuit of claim 1 wherein a width-to-length ratio of the fourth PMOS transistor is larger than half a width-to-length ratio of the second PMOS transistor.

9. The receiver start-up compensation circuit of claim 1 wherein a width-to-length ratio of the second PMOS transistor is larger than a width-to-length ratio of the first PMOS transistor.

10. The receiver start-up compensation circuit of claim 1 wherein the bias voltage source is a positive voltage source.

11. A receiver start-up compensation circuit comprising:

a bias voltage source for providing a bias voltage;

a current mirror circuit for providing a current at an output end, the current mirror comprising:

a reference current source;

a first PMOS transistor including:

a source coupled to the bias voltage source;

a drain coupled to the reference current source; and a gate coupled to a bias end of the current mirror circuit and the drain of the first PMOS transistor; and a second PMOS transistor including:

a source coupled to the bias voltage source;

a drain coupled to the output end of the current mirror circuit; and a gate coupled to the bias end of the current mirror circuit;

a power-down switch coupled to the output end of the current mirror circuit for controlling access of the current generated by the current mirror circuit based on a first control signal received at a control end of the power-down switch; and a compensating unit coupled to the bias end of the current mirror circuit and the power-down switch for stabilizing voltages at the bias end of the current mirror circuit by providing charges at the bias end of the current mirror circuit based on signals received at control ends of the compensating unit, the compensating unit comprising:

a capacitor having a first end directly coupled to the bias end of the current mirror circuit, wherein a second end of the capacitor is selectively coupled to the output end of the receiver start-up compensation circuit or to receive the bias voltage, and the capacitor serves as a capacitor regardless of the status of the bias voltage;

a first control switch coupled between the second end of the capacitor and the bias voltage source, and including a control end coupled to receive the first control signal for controlling passages between the capacitor and the bias voltage source; and a second control switch coupled between the second end of the capacitor and the power-down switch, and including a control end coupled to receive a second control signal for controlling passages between the capacitor and the power-down switch.

12. The receiver start-up compensation circuit of claim 11 wherein the output end of the current mirror circuit is decoupled from the output end of the receiver start-up compensation circuit when the receiver start-up compensation circuit operates in a power-down mode.

13. The receiver start-up compensation circuit of claim 12 wherein the second end of the capacitor is coupled to the output end of the receiver start-up compensation circuit when the receiver start-up compensation circuit operates in the power-down mode.

14. A receiver start-up compensation circuit comprising:

a bias voltage source;

a current mirror circuit for providing a current at an output end, the current mirror comprising:

a reference current source;

a first PMOS transistor including:

a source coupled to the bias voltage source;

a drain coupled to the reference current source; and a gate coupled to a bias end of the current mirror circuit and the drain of the first PMOS transistor; and a second PMOS transistor including:

a source coupled to the bias voltage source;

a drain coupled to the output end of the current mirror circuit; and a gate coupled to the bias end of the current mirror circuit;

a power-down switch coupled to the output end of the current mirror circuit for controlling access of the current generated by the current mirror circuit based on a first control signal received at a control end of the power-down switch; and a compensating unit coupled to the bias end of the current mirror circuit and the power-down switch for stabilizing voltages at the bias end of the current mirror circuit by providing charges at the bias end of the current mirror circuit based on signals received at control ends of the compensating unit, wherein the compensating unit comprises:

a capacitor having a first end directly coupled to the bias end of the current mirror circuit, the capacitor serving as a capacitor regardless of the status of the first control signal;

a first switch coupled between a second end of the capacitor and the bias voltage source, and including a control end coupled to receive the first control signal for controlling passages between the capacitor and the bias voltage source; and a second switch coupled between the second end of the capacitor and the power-down switch, and including a control end coupled to receive a second control signal for controlling passages between the capacitor and the power-down switch.

15. The receiver start-up compensation circuit of claim 14 wherein the second control switch includes a control end coupled to receive a second control signal having a phase opposite to that of the first control signal for controlling passages between the fourth PMOS transistor and the power-down switch.

16. The receiver start-up compensation circuit of claim 14 wherein the first and second control switches include PMOS transistors.

17. The receiver start-up compensation circuit of claim 14 wherein a capacitance of the capacitor is equal to a gate-to-drain capacitance of the second PMOS transistor.

18. The receiver start-up compensation circuit of claim 14 wherein a capacitance of the capacitor is larger than a gate-to-drain capacitance of the second PMOS transistor.

* * * * *